United States Patent [19]

Bristol

[11] Patent Number: 4,495,470
[45] Date of Patent: Jan. 22, 1985

[54] OFFSET BALANCING METHOD AND APPARATUS FOR A DC AMPLIFIER

[75] Inventor: Lloyd R. Bristol, Tigard, Oreg.

[73] Assignee: Tektronix, Inc., Beaverton, Oreg.

[21] Appl. No.: 464,284

[22] Filed: Feb. 7, 1983

[51] Int. Cl.³ .............................................. H03F 1/26
[52] U.S. Cl. ........................................... 330/9; 330/51
[58] Field of Search ................... 330/9, 51, 129, 149, 330/279

[56] References Cited

U.S. PATENT DOCUMENTS

| 4,209,753 | 6/1980 | Riley | 330/51 |
| 4,297,642 | 10/1981 | Baldwin et al. | 330/9 |
| 4,310,243 | 1/1982 | Brown et al. | 330/9 |

Primary Examiner—James B. Mullins
Assistant Examiner—Steven J. Mottola
Attorney, Agent, or Firm—George T. Noe

[57] ABSTRACT

Offset balancing method and apparatus for a DC amplifier including gain selection and polarity switching circuits are disclosed. During the offset compensation process, the amplifier input is connected to ground and its polarity is switched between the normal and inverted states before detecting the resulting output DC levels. The difference between such output DC levels is used to generate an offset compensation signal to be applied to the amplifier. The offset compensation process is repeated for each gain selection of the DC amplifier.

9 Claims, 3 Drawing Figures

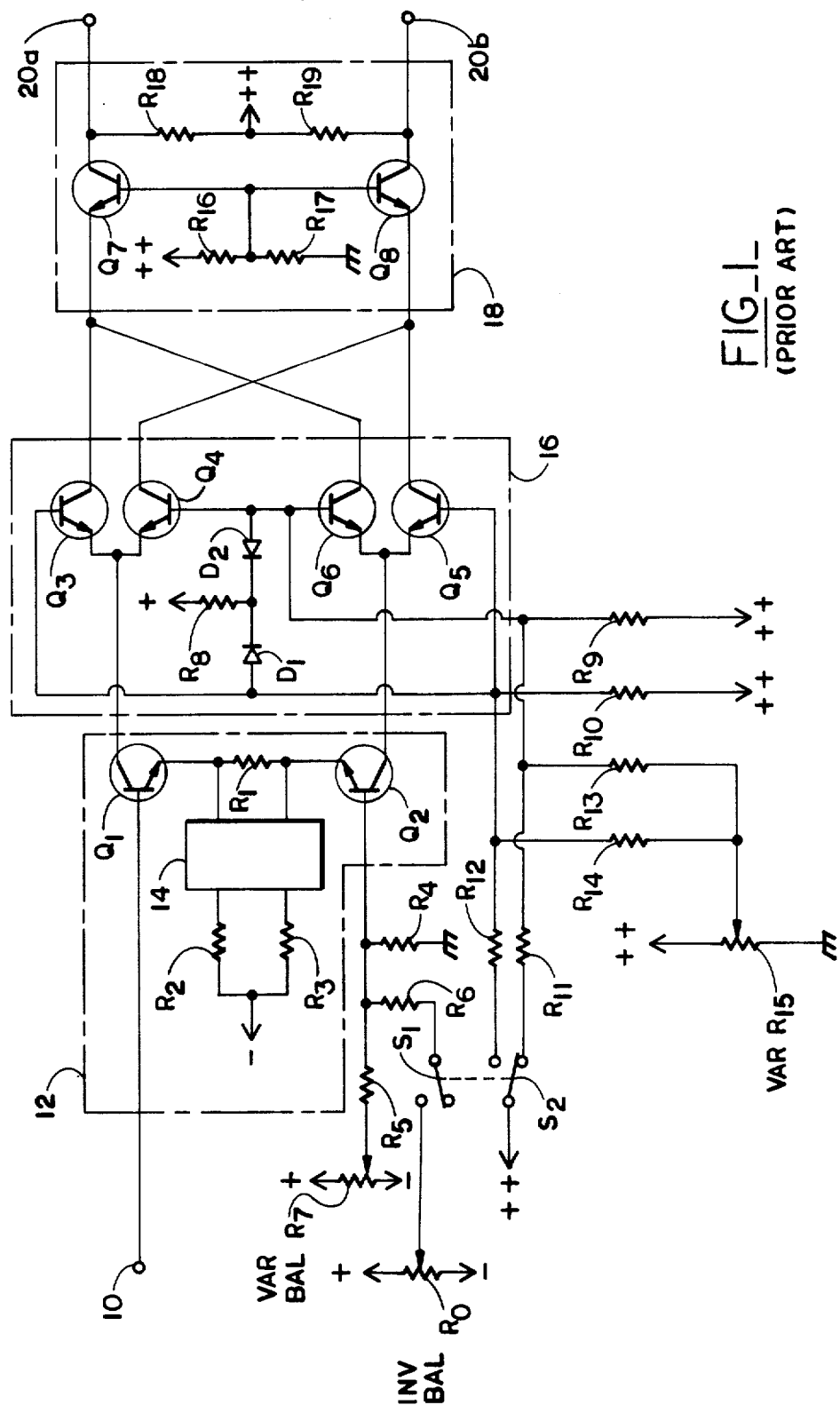
FIG_1_
(PRIOR ART)

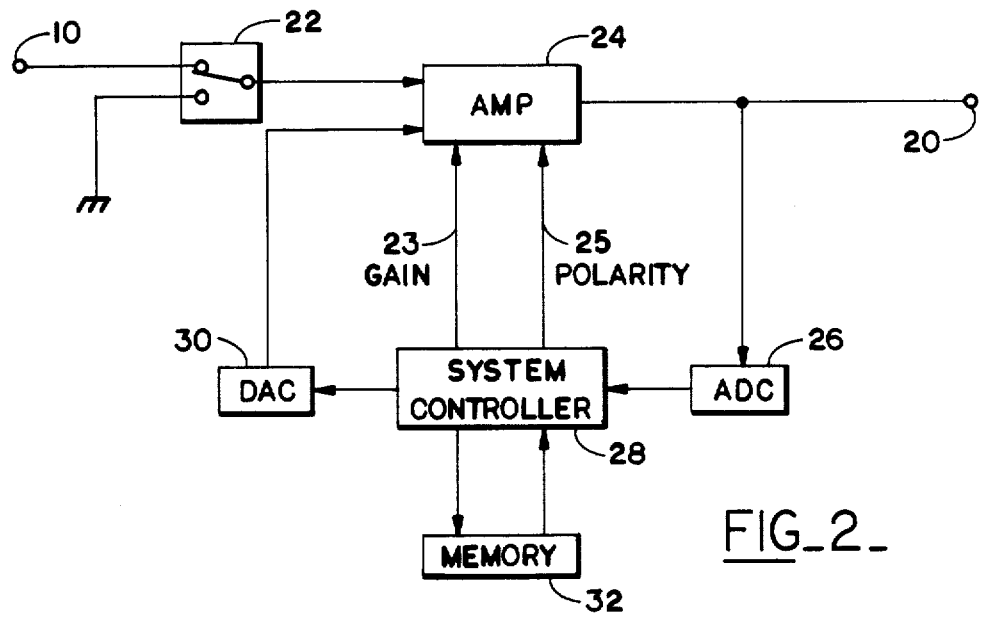
FIG_2_
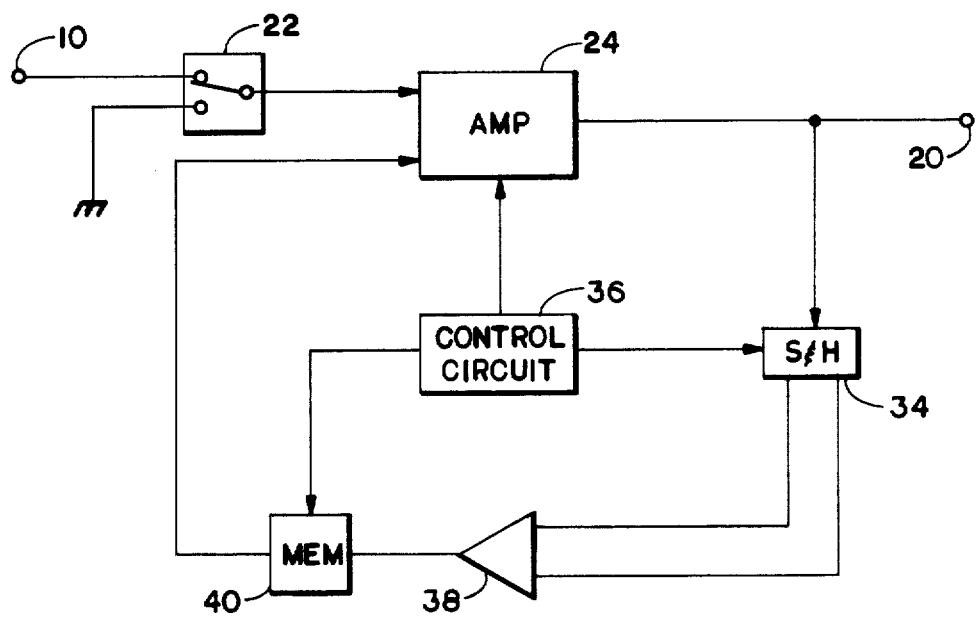
FIG_3_

OFFSET BALANCING METHOD AND APPARATUS FOR A DC AMPLIFIER

BACKGROUND OF THE INVENTION

This invention relates generally to a DC amplifier, and more particularly to an offset balancing method and apparatus for such amplifier.

DC amplifiers include a single or a plurality of amplifier stages each coupled by way of DC coupling components and find wide application in wideband amplifiers for electronic instrumentation products, such as vertical amplifiers for oscilloscopes. For oscilloscope applications, amplifiers are required to exhibit flat frequency response, and low drift, and normally take differential circuit configuration including gain control and polarity switching sections.

A typical DC amplifier suited for such applications is shown in FIG. 1. The DC amplifier comprises input terminal 10, paraphase input amplifier stage 12, gain and polarity control intermediate state 16, and output amplifier stage 18. Input stage 12 comprises a pair of transistors Q1-Q2, gain setting resistor R1 coupled between the emitters of transistors Q1-Q2, emitter long-tail resistors R2-R3 and frequency response compensation network 14 that may include both variable and fixed capacitors and resistors. Coupling resistor R1 may be switched to a plurality of different values, or transistors Q1-Q2 may be multiple-emitter transistors including respective coupling resistors of different reseitance for switching the gain of the DC amplifier. Intermediate stage 16 includes two pairs of transistors Q3-Q4 and Q5-Q6, a pair of diodes D1-D2 and bias circuitry for supplying a controllable bias current to diodes D1-D2. This state 16 provides stabilized output of any desired gain and polarity depending linearly on the difference current flowing through diodes D1 and D2. Output stage 18 comprises a pair of common base transistors Q7-Q8, the bases of which are coupled to the junction voltage of voltage divider consisting of resistors R16 and R17. The collectors of transistors Q7 and Q8 are tied to voltage source (+ +) each through load resistor R18 and R19, respectively, and also define a pair of output terminals 20a and 20b.

The bias circuit for diodes D1 and D2 in intermediate stage 16 comprises fixed resistors R8 through R14, variable resistor R15 and a single pole, double throw switch S2 that controls the polarity. Variable resistor R15 is used to control the gain of the DC amplifier. On the other hand, connected to the base of transistor Q2 in input amplifier stage 12 are fixed resistors R4 through R6, variable resistors R7 and R0 and switch S1 which is operably ganged with S2.

In operation, input stage 12 converts the single-ended input signal applied to input terminal 10 into a differential or push-pull output currents from the collectors of transistors Q1 and Q2. Variable resistor R7 provides a controllable base bias voltage to Q2 to offset any imbalance of the amplifier, i.e. to provide equal or balanced collector output currents from transistors A1 and Q2 when the input signal is zero. Resistor R7 is, therefore, called "variable balance". The collector current of transistor Q1 is split by transistors Q3 and Q4 before reaching the emitters of transistors Q7 and Q8, respectively. Similarly, the collector current of transistor Q2 is split by transistor Q6 and Q5. The current split ratio of transistors Q3-Q4 and Q5-Q6 is a function of the bias current to diodes D1 and D2. Since the collector signal currents from transistors Q3 and Q6 are opposite polarity to each other and so are the collector signal currents from transistors Q4 and Q5, they are subtracted at the respective node or the emitter of transistors Q7 and Q8. Variable resistor R15 is used to control the gain of the DC amplifier by controlling the current splitting ratio. Switch S2 is used to select either normal or inverted gain of the DC amplifier. In the shown position of S2, more bias current flows in diode D2, thereby rendering transistors Q4 and Q6 more conductive. The output voltage at output terminal 20a is in phase with respect to the input signal at input terminal 10 because the collector current of transistor Q6 is predominant over that of transistor Q3 at output terminal 20a. At the other (or upper) position of switch S2, more bias current flows in diode D1, thereby switching the DC amplifier to an inverting amplifier. The porper offset voltage is normally changed as the amplifier polarity is switched because of differences in circuit parameters, especially electrical characteristics of transistors Q3 through Q6. The inverted balance control resistor R0 is used for offset balancing in the inverted position of the amplifier.

Careful selection of the circuit parameters and components may minimize the need for inverted balance control, but will increase the production cost. Another problem is the need for very complicated circuitry and offset balancing procedures when the amplifier includes a gain switching stage to provide a plurality of gains of the DC amplifier. For example, when emitter coupling resistor R1 is changed, by means practical in monolithic integrated circuits, to provide a different amplifer gain, the proper offset balancing voltage may also be different, thereby making the offset balancing circuit very complicated.

SUMMARY OF THE INVENTION

In accordance with the present invention, an offset balancing method and apparatus for a DC amplifier is provided with an automatic offset voltage control means that monitors the output voltage of the amplifier to which a ground reference voltage is applied as an input signal. A system controller provides a DC offset compensation voltage to the amplifier to balance the output. Data corresponding to optimum DC offset compensation voltages for each gain setting of the DC amplifier are stored in a memory and the resulting voltage for each selected gain setting is supplied to the DC amplifier.

It is therefore an object of the present invention to provide an automatic offset balancing method and apparatus for a DC amplifier.

It is another object of the present invention to provide an offset balancing method and apparatus for a switchable gain differential DC amplifier.

It is yet another object of this invention to provide an offset balancing method and apparatus for a DC amplifier including a position control therein.

Other objects, features, and advantages of this invention will become apparent to those skilled in the art upon a reading of the following description when taken in conjunction with the accompanying drawings.

BRIEF DESCRIPTION OF THE DRAWINGS

FIG. 1 is a circuit schematic of a typical DC amplifier;

FIG. 2 is a block diagram of one preferred embodiment of this invention; and

FIG. 3 is a block diagram of another embodiment of this invention.

DETAILED DESCRIPTION OF THE INVENTION

Referring now to FIG. 2, a simplified block diagram of an offset balancing circuit for a DC amplifier embodying the present invention is shown. Amplifier 24 may be any differential input type amplifier such as, for example, the one shown in FIG. 1. Coupled to amplifier 24 is a system controller 28 by way of two control lines 23 and 25 for controlling the gain and selecting polarity, respectively. Connected to one input terminal of amplifier 24 is input selector 22 for selecting either an input signal applied to input terminal 10 or a ground reference potential.

The output of amplifier 24 is applied to output terminal 20 and is coupled to analog-to-digital converter (ADC) 26 to convert the output voltage from amplifier 24 into a digital representation thereof. ADC 26 may be any conventional design and preferably may be a 10-bit or higher resolution ADC to maintain high correction accuracy. The digital output from ADC 26 is then supplied to system controller 28, which suitably may include a commercially available microprocessor (μp) and associated devices including a digital-to-analog converter (DAC). The μp operates in accordance with stored program instructions and control signals entered from front panel controls or a keyboard (not shown). Output data from memory 32 is applied by system controller 28 to digital-to-analog converter (DAC) 30. DAC 30 converts the digital output data from system controller 28 into an analog signal or a DC offset compensation signal to be applied to the other input terminal of differential amplifier 24.

The function of ADC 26 may be performed by a controller, a digital-to-analog converter and a voltage compartor. The controller determines a digital representation of the voltage by monitoring the output of the comparator as it compares the output of the DAC, driven by the controller, and the voltage from the amplifier. This method is particularly advantageous if the comparator is the one used to initiate and oscilloscope sweep in normal operation.

In operation, the offset balancing circuit in FIG. 2 normally operates to amplify the input signal applied to input terminal 10 by differential amplifier 24 with the gain and polarity selected by system controller 28 through gain control line 23 and polarity control line 25. System controller 28 provides output data from memory 32 to DAC 30 so that DAC 30 supplies the appropriate DC offset compensation signal to amplifier 24 depending on the selected gain. ADC 26 is not in operation under the normal condition. Any desired gain and polarity may be selected either manually or automatically.

During the offset balancing procedure, switch 22 is connected to ground to supply the ground reference potential to one input of differential amplifier 24. Now, system controller 28 provides control data by way of polarity control line 25 to amplifer 24 for alternately switching the output polarity of amplifier 24. For example, switch S2 in FIG. 1 amplifier is switched between its two fixed terminals. However, such polarity switching may preferably be made by using an electronic switch such as a so-called current switch controlled by any conventional logic circuit. The output voltage on output terminal 20 or any other convenient point of amplifier 24 is digitized by ADC 26 while system controller 28 directs amplifier 24 successively to normal and inverted polarity states. The two digital data representing the output DC voltages for the normal and inverted polarities of amplifier 24 are fed to system controller 28 that calculates the difference between the two digital data or DC levels. If the offset voltage to amplifier 24 is improper, the difference data is other than zero volts and system controller 28 determines a new value for the DC offset compensation that will tend to reduce the difference in DC output levels. The digital value is again converted into a analog DC offset compensation voltage before being applied to the other input terminal of amplifier 24. The cycle of applying an approximate DC offset correction, determining the difference in output DC levels between the normal and inverted polarities, and determining an improved approximation for the DC offset compensation continues until the difference between DC output levels in both polarity states is sufficiently small. The final, optimal value of the DC offset compensation data in digital form is stored im memory 32.

The aforementioned DC offset compensation process is then repeated for different gain settings of amplifier 24 by applying proper gain selection data from system controller 28 over gain control line 23. Preferably, such offset compensation process is carried out automatically in accordance with a DC offset compensation program stored in the μp within system controller 28 when once enabled by the operator or whenever the power switch of the apparatus such as an oscilloscope employing the DC amplifier is turned on. If the DC offset compensation process has been performed, DC amplifier 24 is ready to operate with optimal DC offset compensation at any given setting.

The foregoing operation is unaffected even in a case where a positioning voltage or current is applied to any of the terminals of transistors Q7 and Q8. Thus, a balance of the input and inversion stages is obtained, independent of offsets in later stages.

The DC offset compensation may be made conveniently by analog means, especially when the number of available gain settings is limited. Such an example is shown in FIG. 3 as a block diagram. Input selection switch 22 and amplifier 24 may be identical to the corresponding elements in FIG. 2. The polarity of amplifier 24 is switched between the normal and inverted states by control circuit 36 that may comprise pulse generators such as multivibrators operated under control of a clock generator. The instantaneous output voltages from amplifier 24 are sampled by sample and hold circuit (S and H) 34 under control of control circuit 36. The sampled output voltages at the normal and inverted polarities of amplifier 24 are fed to differential amplifier 38. The difference DC output voltage from differential amplifier 38 is then applied to the other input terminal of amplifier 24 by way of analog memory 40. It should be noted that the DC offset compensation loop including amplifier 24 constitutes a negative feedback loop to minimize the difference DC level from differential amplifier 38. Control circuit 36 provides a control signal to hold the output voltage after allowing some settling time. Such a DC offset compensation process may be repeated at different gain settings of amplifier 24. S and H 34, differential amplifier 38 and analog memory 40 may be of any conventional design and the DC offset compensation process may be repeated at any desired interval, for example, during the sweep retrace period of the oscilloscope using such DC amplifier.

In summary, the DC offset compensation process according to the present invention incorporates a polarity inverting section within the DC amplifier and the output voltages therefrom at the normal and inverted polarities are detected for minimizing the difference between such output voltages by varying the DC offset compensation level to the DC amplifier. Optimal DC offset compensation voltage can easily and automatically be obtained even if DC level control means such as a position control in an oscilloscope vertical amplifier may be included. The DC offset compensation can be performed for each gain selection and optimal DC offset compensation data for each gain selection may be stored.

While there has been shown and described the preferred embodiments according to the present invention, it will be apparent to those skilled in the art that many changes and modifications may be made depending on particular applications without departing from the invention in its broader aspects. It is therefore contemplated that the scope of this invention by interpreted by the appended claims.

What I claim as being novel is:

1. An offset balancing circuit for a differential DC amplifier, comprising:
   input switching means for selectively applying an input signal and ground potential to one input of said DC amplifier;
   polarity switching means for alternately switching the polarity of said DC amplifier between the normal and inverted states;
   detection means for detecting the output DC voltages from said DC amplifier in the normal and inverted states while applying the ground potential to one input of said DC amplifier; and
   control means for providing DC offset compensation voltage relating to the voltage difference between the output DC voltages from said detection means to the other input of said DC amplifier.

2. An offset balancing circuit for a DC amplifier in accordance with claim 1 wherein said DC amplifier includes a gain selection stage to select a plurality of different gains under control of said control means and the DC offset compensation voltage for each gain setting is stored in a memory.

3. An offset balancing circuit for a DC amplifier in accordance with claim 1 wherein said DC amplifier is a differential amplifier including a pair of input terminals to receive respectively the input signal and the DC offset compensation signal.

4. An offset balancing circuit for a DC amplifier in accordance with claim 1 wherein said detection means is an analog-to-digital converter.

5. An offset balancing circuit for a DC amplifier in accordance with claim 4 wherein said analog-to-digital converter incorporates a voltage comparator which is also used as part of the sweep signal triggering function in an oscilloscope.

6. An offset balancing circuit for a DC amplifier in accordance with claim 1 wherein said control means includes a microprocessor.

7. An offset balancing circuit for a DC amplifier in accordance with claim 6 wherein said DC amplifier is a gain selectable amplifier and said control means stores an optimal DC offset signal for each gain setting.

8. An offset balancing method for a differential DC amplifier including a polarity switching section, comprising the steps of:
   connecting one input of said DC amplifier to a ground potential;
   switching the polarity of said DC amplifier alternately between the normal and inverted states;
   detecting the output voltages from said DC amplifier in the normal and inverted states; and
   generating an offset compensation signal relating to the difference between the detected output voltages in both polarities, said offset compensation signal being applied to the other input of said DC amplifier.

9. An offset balancing method for a DC amplifier in accordance with claim 8 wherein said DC amplifier is a gain selectable amplifier and said offset balancing process is repeated for each gain selection and said method further includes a step for storing the final offset compensation signal for each gain selection.

* * * * *